United States Patent [19]

Coene et al.

[11] Patent Number: 5,654,547
[45] Date of Patent: Aug. 5, 1997

[54] METHOD FOR PARTICLE WAVE RECONSTRUCTION IN A PARTICLE-OPTICAL APPARATUS

[75] Inventors: Willem M. J. Coene; Augustus J. E. M. Janssen, both of Eindhoven, Netherlands

[73] Assignee: U.S. Philips Corporation, New York, N.Y.

[21] Appl. No.: 617,655

[22] Filed: Mar. 15, 1996

[30] Foreign Application Priority Data

Mar. 16, 1995 [EP] European Pat. Off. .............. 95200630

[51] Int. Cl.$^6$ .................................................. H01J 37/26
[52] U.S. Cl. ............................. 250/307; 250/311
[58] Field of Search ............................... 250/307, 311

[56] References Cited

U.S. PATENT DOCUMENTS

| | | | |
|---|---|---|---|
| 3,829,691 | 8/1974 | Hufnagel | 250/311 |
| 5,134,288 | 7/1992 | Van Dijck | 250/307 |
| 5,432,347 | 7/1995 | Coene | 250/307 |
| 5,466,937 | 11/1995 | Kruit | 250/311 |

OTHER PUBLICATIONS

"Improved High Resolution Image Processing of Bright Field Electron Micrographs" by E.J. Kirkland, Ultramicroscopy 15, (1984), pp. 151–172.

"Contrast Transfer of Crystal Images in TEM" by K. Ishizuka, Ultramicroscopy 5 (1980), pp. 55–65.

"Principles of Optics" M. Born et al, Pergamon Press, pp. 526–535.

*Primary Examiner*—Jack I. Berman
*Attorney, Agent, or Firm*—Jack D. Slobod

[57] ABSTRACT

In a method for the iterative formation of an image of a specimen in a particle-optical apparatus a series of experimental images (the experimental series) is recorded with each time a different setting of an imaging parameter (for example, the focal distance), and a comparable series of images is calculated on the basis of the electron wave at the specimen (the estimation). The two series are compared and on the basis thereof an electron wave is calculated (the feedback) with which a new series of images is calculated which better approximates the experimental series. This iteration step is repeated until the correspondence between the experimental series and the calculated series is sufficient, after which the associated electron wave is considered to be the desired image of the specimen. A substantial gain as regards calculation time can be achieved during the estimation step as well as during the feedback step by executing the operation of the invention by means of FFTs. This is possible by writing the correlation expressions to be calculated in both steps in accordance with the invention in such a manner that they occur as pure correlation integrals which can be calculated by means of FFTs. The calculation time required when use is made of FFTs is substantially shorter than in the case of explicit calculation of the correlation expressions in conformity with the state of the art. The calculation time can thus be reduced by a factor of the order of magnitude of 50,000.

13 Claims, 8 Drawing Sheets

METHOD FOR PARTICLE WAVE RECONSTRUCTION IN A PARTICLE-OPTICAL APPARATUS

BACKGROUND OF THE INVENTION

1. Field of the Invention

The invention relates to a method for iterative formation of an image of a specimen to be studied in a particle-optical apparatus.

2. Description of the Related Art

A method of this kind is described in an article by E. J. Kirkland: "Improved high resolution image processing of bright field electron micrographs", Ultramicroscopy 15, (1984), pp. 151–172.

The cited article describes a method for forming an image in an electron microscope by formation of a series of images of a specimen to be examined, each image being formed with a different setting of the focal distance of the imaging lens in the vicinity of the setting for optimum focus. The series thus formed is referred to as a defocus series. The resolution of the microscope can thus be improved in principle by way of calculations performed on the defocus series so as to eliminate the effect of imaging errors. In this context resolution is to be understood to mean the information (in the image or specimen wave) which can be interpreted directly and which is no longer influenced by image artefacts caused by the lens faults. In a field emission TEM (Transmission Electron Microscope), the resolution improvement may be as high as a factor two because of the high degree of coherence in the HRTEM image (High-Resolution TEM), leading to a high information limit. In a TEM equipped with a thermionic source the gain in resolution is less but nevertheless high enough to make sense from a technical point of view. Instead of the focus setting, other relevant particle-optical parameters can be varied, for example the tilting of the electron beam through the objective lens.

As is known, the information concerning the microstructure of a specimen to be studied in an electron microscope is contained in the electron beam whereby the specimen is imaged on a detector (for example, a photographic film or a video camera) by lenses provided in the electron microscope. The wave character of the electrons in the beam describes this information by means of a complex electron wave function $\phi(\vec{r})$ defining the phase and the amplitude of the electron wave as a function of the two-dimensional position vector $\vec{r}$ perpendicular to the beam in the specimen. In HRTEM direct measurement of the complex electron wave function at the level of the specimen plane is not possible; instead the amplitude squared distribution of the electron wave at the level of the detector is measured, which measurement can be carried out for different settings of the imaging parameters, such as the focal distance of the imaging lens.

In the cited article a first assumption is made as regards the electron wave function $\phi(\vec{r})$ immediately behind the specimen. In the context of the invention it is not of essential importance how this assumption is arrived at. The electron wave function assumed need not be a representation of the actual electron wave function as it occurs when the specimen is actually irradiated, but merely constitutes a starting point for further mathematical processing of an iterative nature and for comparison with actual images of the specimen in order to reconstruct said actual electron wave function (being a representation of the microstructure of the specimen).

The method known from the cited article can be briefly summarized in the form of the following steps a to e:

a On the basis of the assumed electron wave function $\phi(\vec{r})$ a calculation is performed for a series of images which would be obtained by means of this electron wave function for a number of settings of the imaging lens around the setting for optimum focus, i.e. the so-called defocus series. Because this calculation is not based on the actual electron function but on the assumed electron wave function, this process is referred to as the estimation of the defocus series.

b The defocus series thus obtained is compared with the series of experimental images (the defocus series). A so-called differential series is obtained by subtracting the estimated series from the real series.

c Because the aim is to minimize the difference between the estimated series and the real series, a minimalization procedure is applied to the differential series, i.e. the so-called "MAximum Likelihood" procedure (MAL), producing a rule concerning the further iterative processing of the differential series.

d On the basis of the differential series, a calculation is made, using the MAL rule, for a correction function which is used as a correction for the initially assumed electron wave function, thus producing a corrected electron wave function. This calculation of the corrected electron wave function is referred to as the "feedback" step.

e The electron wave function thus corrected can itself serve as a starting point for an iterative processing operation in conformity with the above points a to d, said operations being stopped when the differences between the estimated series and the real series become smaller than a desired value.

The above steps of the known method, as implemented in conformity with the cited article, have a number of drawbacks, the drawback of step a will be described first.

The above step a will be described in detail hereinafter. This step is known per se from an article by K. Ishizuka: "Contrast transfer of crystal images in TEM", Ultramicroscopy 5 (1980), pp. 55–65.

The calculation of the estimated defocus series is based on the electron wave function $\phi(\vec{r})$ immediately behind the specimen. It is also assumed that the transfer function $p(\vec{G})$ of the optical system of the electron microscope is known. (As is known in this technique, the transfer function of an electron microscope describes the coherent effect of image abberations in the imaging by these apparatus. The "coherent" image abberations concern spherical abberation and the focus setting of the microscope. Incoherent imaging errors must also be taken into account, for example (i) the spread in respect of the directions of incidence of the (non-correlated) electron wave fronts incident on the specimen (known as the spatial incoherence), and (ii) the electronic instabilities in the electron microscope, coupled to the chromatic abberation of the objective lens (known as the temporal incoherence)). As is customary, this transfer function is expressed as a function of the spatial frequencies $\vec{G}$ ($G=\theta/\lambda$, in which $\theta$ is the diffraction deflection angle in the specimen and $\lambda$ is the wavelength of the electron wave; because the deflection can occur in two independent directions, G has a vector character: $\vec{G}$) which can occur in the specimen.

The image quality in a HRTEM is determined to a substantial degree by the so-called temporal incoherence which is caused by instabilities in the electron emission and electron acceleration and in the lens currents. The position of the focal point of the imaging lens, i.e. the imaging in the imaging system, is influenced by a number of variables such as the acceleration voltage of the electron beam, the thermal energy of the electrons in the beam, and the drive current for the objective lens, being the most important imaging (magnetic) lens. Each of these quantities inevitably exhibits a spread with respect to their nominal value (for example, due to noise or thermal spreading), which can be expressed as an additional defocusing with respect to the nominal adjusted focus which can be calculated since the effect of each of these variables on the image is known. The spread in said variables thus causes a spread in the focal distance which exhibits a normal distribution around the adjusted focal distance. Each value of the focal distance which deviates from the nominally adjusted value leads to a respective different value of the transfer function $p(\vec{G})$, that is to say $p_i(\vec{G})$. This phenomenon, being known as temporal incoherence as stated before, is taken into account in the estimation step in that $I(\vec{R})$ (in which I, being the intensity in the image, is dependent on the two-dimensional position vector $\vec{R}$ in the image) is considered to be the weighted mean value of the sub-images $I_i(\vec{R})$ associated with each of the individual transfer functions, the weighting factors being the associated values of the focal distribution which is a normal distribution function. This weighted mean value is mathematically expressed as an integral over the focus parameter of the product of the focal distribution function and the intensity distribution of the sub-images; in a numerical elaboration thereof this integral is replaced by a summing operation as follows:

$$I(\vec{R}) = \sum_i g_i I_i(\vec{R}) \tag{1}$$

Numerically the focal distribution function is sampled with a limited series of (2M+1) equidistant focal points with a spacing $\epsilon$, centred around the nominal focus setting as represented by the maximum of the focal distribution function. For each of these points i, $g_i$ represents the weighting factor of the normal focal distribution function associated with the $i^{th}$ sub-image $I_i(\vec{R})$ of the series of sub-images to be summed. For the sake of simplicity of representation, the expression (1) will be used hereinafter for the analytical integral over the focal distribution function represented by $g_i$ as well as for the numerical representation thereof. In the latter case the index i runs from the minimum value −M to the maximum value +M, so that there are 2M+1 terms in the sum of the expression (1). The set of values $g_i$, where −M≦i≦+M (defined on the equidistant focal points with a spacing $\epsilon$), is known as the "focal kernel".

The effect of the temporal incoherence is described in the frequency domain by means of the so-called Transmission-Cross-Coefficient (TCC) elaborated in the cited article by Ishizaka in analogy with the wave theory in light optics (see M. Born and E. Wolf "Principles of Optics", Pergamon, London, 1975). Hereinafter the line of thought is described leading, for image estimation, to this formalism as described in expression (12).

In order to enable calculation of the sub-image $I_i(\vec{R})$ to be ultimately formed, it must be taken into account that $I_i(\vec{R})$ is the modulus squared of the wave function $\psi_i(\vec{R})$ at the area of the image, so that $$I_i(\vec{R}) = \psi_i(\vec{R}) \times \psi_i^*(\vec{R}) = |\psi_i(\vec{R})|^2 \tag{2}$$

so the modulus squared of a complex function, $\psi_i^*(\vec{R})$ being the complex conjugate of $\psi_i(\vec{R})$. $I_i(\vec{R})$ represents the distribution of the probability of the electron being struck at the detector location having the coordinates $\vec{R}$, characterized by the wave function $\psi_i(\vec{R})$ which is realised by the transfer function $p_i$ for a focus setting $f_i = f + i\epsilon$, in which f is the nominal adjusted focal distance. As is generally known from imaging theory, the frequency contents $I_i(\vec{G})$ of the sub-image $I_i(\vec{R})$ are given by the Fourier transform FT of $I_i(\vec{R})$:

$$I_i(\vec{G}) = FT\{I_i(\vec{R})\} = FT\{\psi_i(\vec{R}) \times \psi_i^*(\vec{R})\} = FT\{\psi_i(\vec{R})\} \oplus FT\{\psi_i^*(\vec{R})\} \tag{3}$$

(in which "$\oplus$" is the correlation product between two functions $F_1$ and $F_2$: $F_1(x) \oplus F_2(x)$ per definition equals $\int F_1(x+u).F_2(u).du$).

The Fourier transform of a wave function $\psi_i(\vec{R})$ at the area of the detector is written as $\psi_i(\vec{G})$, so FT $\{\psi_i(\vec{R})\} = \psi_i(\vec{G})$, so that the expression (3) becomes:

$$I_i(\vec{G}) = \psi_i(\vec{G}) \oplus \psi_i^*(\vec{G}) \tag{4}$$

The transformed wave function $\psi_i(\vec{G})$ is the result of the multiplication in the frequency domain of the transfer function by the electron wave function immediately behind the specimen $\phi(\vec{G})$ as can be expressed by the following formula:

$$\psi_i(\vec{G}) = \phi(\vec{G}) \times p_i(\vec{G}) \tag{5}$$

The expression (5) describes the propagation through the electron optical lens system of the electron wave from the specimen as far as the detector with a focus setting $f_i = f + i\epsilon$. Using (4) and (5), the expression (3) becomes:

$$I_i(\vec{G}) = \{\phi(\vec{G}) \times p_i(\vec{G})\} \oplus \{\phi^*(\vec{G}) \times p_i^*(\vec{G})\} \tag{6}$$

or, by application of the definition of the correlation product to expression (6):

$$I_i(\vec{G}) = \int \phi(\vec{G}+\vec{G}') \times p_i(\vec{G}+\vec{G}') \times \phi^*(\vec{G}') \times p_i^*(\vec{G}') \times d(\vec{G}') \tag{7}$$

Application of the Fourier transformation to expression (1) shows that:

$$I(\vec{G}) = FT\{I(\vec{R})\} = FT\left\{ \sum_i g_i I_i(\vec{R}) \right\} = \sum_i g_i I_i(\vec{G}) \tag{8}$$

so that by combination of (7) and (8):

$$I(\vec{G}) = \sum_i g_i \int \phi(\vec{G}+\vec{G}') \times p_i(\vec{G}+\vec{G}') \times \phi^*(\vec{G}') \times p_i^*(\vec{G}') \times d(\vec{G}') \tag{9}$$

which, using a different arrangement, can be written as:

$$I(\vec{G}) = \int \phi(\vec{G}+\vec{G}') \times \phi^*(\vec{G}') \times d(\vec{G}') \times \sum_i \{g_i \times p_i(\vec{G}+\vec{G}') \times p_i^*(\vec{G}')\} \tag{10}$$

The form $\sum_i \{g_i \times p_i(\vec{G}+\vec{G}') \times p_i^*(\vec{G}')\}$ in the expression (10) is referred to as the Transmission Cross-Coefficient (TCC). In conformity with the derivation known from said article by Ishizuka, the TCC is assumed to equal:

$$TCC = p_{nom}(\vec{G}+\vec{G}') \times p_{nom}*(\vec{G}') \times E_{fs}(\vec{G}+\vec{G}',\vec{G}') \quad (11)$$

in which $p_{nom}(=p_{i=0})$ is the transfer function applicable to the nominal setting f of the focal distance (i.e. without taking into account the temporal incoherence), and $E_{fs}$ is the envelope function for the focal spread which equals $\exp[-A\{(\vec{G}+\vec{G}')^2-(\vec{G}')^2\}^2]$, where $A=(\pi\Delta\lambda)^2/2$, in which $\Delta = C_c\{(\Delta V/V)^2+(\Delta E/E)^2+4(\Delta I/I)^2\}^{1/2}$. ($C_c$=the chromatic abberation constant, V=the acceleration voltage of the electron beam, E=the thermal energy of the electrons upon departure from the electron emitter, I=the drive current of the imaging lens). By insertion of TCC, the expression (10) becomes:

$$I(\vec{G}) = \int \phi(\vec{G}+\vec{G}') \times \phi*(\vec{G}') \times d(\vec{G}') \times TCC \quad (12)$$

As has already been stated, the image in an electron microscope is formed by forming a series of K images of a specimen to be examined, each time with a different setting of the focal distance of the imaging lens around the setting for optimum focus. With each ($n^{th}$) setting of the lens there is associated a separate TCC, so that in the expression (12) (applicable to the $n^{th}$ image), in general $TCC_n$ occurs with a total of K different TCCs.

The estimation of an image in the described manner will have to be performed by numerical integration. A problem is then encountered which can be explained as follows. Because of the presence of the $TCC_n$ (dependent on the vectors $\vec{G}$ and $\vec{G}'$) as an additional weighting factor in the integration, the integral expression (12) is no longer a pure correlation, so that for numerical integration Fast Fourier Transforms (FFTs) cannot be used so as to circumvent the correlations and the weighted correlation integral must be explicitly calculated. This is then realised as follows: for each value of $\vec{G}$ it is necessary to run through all values of $\vec{G}'$, i.e. for each value of $\vec{G}$ and $\vec{G}'$ the following expressions must be multiplied:

1) $\phi(\vec{G}+\vec{G}')$

2) $\phi*(\vec{G}')$

3) $p_{nom}(\vec{G}+\vec{G}')$

4) $p*_{nom}(\vec{G}')$

5) $E_{fs}(\vec{G}+\vec{G}',\vec{G}')$

The above multiplications must be executed for all values of $\vec{G}$ and $\vec{G}'$. For an image comprising $N=1000\times1000=10^6$ pixels, the vectors $\vec{G}$ and $\vec{G}'$ both have $10^6$ values so that, ignoring the determination of the values of the above five expressions, the formation of the product from the explicit correlation already necessitates the execution of a total of $N^2=10^6\times10^6=10^{12}$ multiplications for one image from the defocus series. It is to be noted that, in addition to the phenomenon of temporal incoherence, another, comparable effect occurs in the mathematical description; this effect stems from the spatial incoherence of the irradiating electron beam. This causes a spread in the direction of incidence of the electrons which will be referred to hereinafter as source spread. The description of this spatial incoherence takes the form of an envelop function $E_{so}(\vec{G}+\vec{G}',\vec{G}')$ for the source spread ($E_{so}$=source) which must in principle be added as a factor to the TCC in the equation (11) in conformity with the cited article by Ishizuka. The form of this envelope function is dependent on the type of electron source used and on the focusing conditions of the condenser lens system. When this source is a pure point source (which cannot be realised in practice), $E_{so}\equiv 1$. If this source is a thermionic source (for example, the known $LaB_6$ source), a function $E_{so}(\vec{G}+\vec{G}', \vec{G}')$ must be added. When this source is the field effect source (Field Emission Gun or FEG), because of the property of high coherence of this type of source for $E_{so}$ in factorized form the following approximate description can be given: $E_{so}(\vec{G}+\vec{G}',\vec{G}')=E_{so}(\vec{G}+\vec{G}',\vec{0}) \times E_{so}(\vec{0},\vec{G}')$. In the expression (11) the term $p_{nom}(\vec{G}+\vec{G}')$ is then combined with $E_{so}(\vec{G}+\vec{G}',\vec{0})$ and the term $p*_{nom}(\vec{G}')$ with $E_{so}(\vec{0},\vec{G}')$. The two products thus formed can be considered to be a modified form of the original function $p_{nom}(\vec{G}+\vec{G}')$ and of the function $p*_{nom}(\vec{G}')$. The new transfer function thus formed also contains a part which represents the amplitude modulation in the frequency domain due to the spatial incoherence, in addition to the phase modulation due to the lens abberations. This does not make an essential difference in respect of the number of calculation operations to be performed.

The feedback step.

As mentioned sub b, c and d in the above section "The background of the state of the art", the estimated defocus series is subtracted from a defocus series actually detected by means of a detector; this is realised by subtracting the intensity values of corresponding pixels of corresponding images from one another. If desired, such subtraction can take place in the frequency domain, i.e. the values of $I_n(\vec{G})$ instead of $I_n(\vec{R})$ are subtracted from one another (the index n relates to the $n^{th}$ item from the defocus series). Thus, a series $\Delta I_n(\vec{G})$ is formed. From this series the correction function $\Delta \phi(\vec{G})$ must be calculated so as to be added to the $\phi(\vec{G})$ assumed at the beginning of the iteration cycle (the electron wave function immediately behind the specimen in terms of the spatial frequency) in order to obtain a new $\phi(\vec{G})$ as a starting point for a new iteration step. The correction wave $\Delta \phi(\vec{G})$ is obtained by averaging over the K individual correction waves of the defocus series $\Delta \phi_n(\vec{G})$, so $\Delta \phi(\vec{G})=(1/K)\Sigma_n \Delta \phi_n(\vec{G})$. The "new" wave is obtained by summing the "old" wave and the correction wave after multiplication by a factor $\gamma$ in which $\gamma$ is a feedback parameter, so that the squared deviation between the real and the estimated defocus series is optimally minimized. Thus, the object is to determine a mathematical procedure for deriving the functions $\Delta \phi_n(\vec{G})$ from the functions $\Delta I_n(\vec{G})$.

The basis for the above mathematical procedure is a known "Maximum Likelihood" procedure (MAL). According to the state of the art (see the cited article by Kirkland, page 167, formula 66) application of this maximum likelihood procedure results in the following rule to be satisfied by the function $\Delta \phi_n(\vec{G})$:

$$\Delta\phi_n(\vec{G})=\int \Delta I_n(\vec{G}-\vec{G}') \times \phi(\vec{G}') \times d(\vec{G}') \times TCC_n(\vec{G}',\vec{G}) \quad (13)$$

in which the various expressions under the integral sign have the same meaning as in the formulas (11) and (12). Like in the arithmetic procedure for the estimation (i.e. the numerical elaboration of the equation (12)), the expression (13) is not a pure correlation integral representing the correlation between $\Delta I_n$ and $\phi(\vec{G})$, but the integrand is weighted by the TCC. For the execution of the explicit weighted correlation again a multiplication (i.e. the factors under the integral sign in the equation (13)) must be performed for each value of $\vec{G}$ and $\vec{G}'$; this again necessitates $N^2$ (in the numerical example: $10^{12}$) multiplications for each item of the defocus series.

SUMMARY OF THE INVENTION

The described iterative procedures for the estimation of an image of the defocus series and for the reconstruction of the electron wave (feedback) have the drawback that for images consisting of a large number of pixels (for example, $N=1000\times1000$), the calculation time becomes so long that implementation of the method according to the state of the art is practically not possible by means of contemporary computers.

The invention has for its object to reduce the calculation time for such a method to such an extent that it can be carried out in practice while maintaining the numerical accuracy of the reconstruction.

To this end, the method of the invention is characterized in that it comprises the steps disclosed in the characterizing part of claim 1.

The estimation step

Like in the state of the art, the frequency contents of $\phi(\vec{G})$ of the wave function are obtained from the electron wave function immediately behind the specimen $\phi(\vec{r})$ by Fourier transformation:

$$\phi(\vec{G}) = FT\{\phi(\vec{r})\} \qquad (14)$$

Like in the state of the art, a defocus series is formed; the estimation of one $I(\vec{G})$ (in terms of the frequency vector $\vec{G}$) of the images of the defocus series will be described hereinafter. Due to the temporal incoherence and the spread in the focal distance caused thereby, the transfer to the image plane is described by a continuum of transfer functions $p(\vec{G})$. These functions $p(\vec{G})$ are replaced by a discrete set of transfer functions $p_i(\vec{G})$ upon numerical solution (with $-M \leq i \leq +M$), so that for the electron wave function $\psi_i(\vec{G})$ (in terms of the frequency vector $\vec{G}$) at the area of the image it holds that:

$$\psi_i(\vec{G}) = p_i(\vec{G}) \times \phi(\vec{G}) \qquad (15)$$

The electron wave function $\psi_i(\vec{R})$ at the area of the image (in terms of the position coordinate $\vec{R}$) is obtained from the electron wave function $\psi_i(\vec{G})$ at the area of the image (in terms of the frequency $\vec{G}$) by inverse Fourier transformation $(FT)^{-1}$:

$\psi_i(\vec{R}) = (FT)^{-1}\{\psi_i(\vec{G})\}$, so that in conjunction with the equation (15) it follows that:

$$\psi_i(\vec{R}) = (FT)^{-1}\{\psi_i(\vec{G})\} = (FT)^{-1}\{p_i(\vec{G}) \times \phi(\vec{G})\} \qquad (16)$$

The partial image $I_i(\vec{R})$ then follows in known manner again from the wave function $\psi_i(\vec{R})$ where $I_i(\vec{R}) = \psi_i(\vec{R}) \times \psi^*_i(\vec{R}) = |\psi_i(\vec{R})|^2$, so that in conjunction with equation (1) it holds for the image $I(\vec{R})$ that:

$$I(\vec{R}) = \sum_i g_i I_i(\vec{R}) = \sum_i g_i |\psi_i(\vec{R})|^2 \qquad (17)$$

The expression (17) thus concerns a sum over the focal kernel of $2M+1$ points. Substitution of the expression for $\psi_i(\vec{R})$ of equation (16) in the equation (17) yields:

$$I(\vec{R}) = \sum_i g_i |(FT)^{-1}\{p_i(\vec{G}) \times \phi(\vec{G})\}|^2 \qquad (18)$$

It is to be noted again that the expression (8) applies only to the estimation of one of the images of a defocus series.

The final expression (18) of the invention then takes the place of the expression (12) known from the state of the art. When the estimation of an image is to be executed in the described manner, numerical integration will have to be applied, like in the state of the art. To this end, for each sub-image $I_i(\vec{R})$ (where $-M \leq i \leq +M$) the expressions $\phi(\vec{G})$ and $p_i(\vec{G})$ must be determined for each value of $\vec{G}$, which expressions must subsequently be multiplied 1:1. For an image of $N=1000\times1000$ pixels, the vector $\vec{G}$ has $10^6$ values, so that the latter 1:1 multiplication must be performed $10^6$ times and the calculation time is directly proportional to N. An inverse Fourier transformation $(FT)^{-1}$ must then be applied to the result of the multiplication. However, as opposed to the state of the art, utilizing the TCC, the operation in accordance with the invention can be performed by means of FFTs because the weighted correlation integral in the expression (12) (weighted by the TCC) is replaced in the expression (18) by the discrete sum over the focal kernel of pure correlation integrals which, as is known, can be calculated by means of FFTs. As is known, when FFTs are used the calculation time required is proportional to $N.^2\log(N)$, in which N is the number of values that can be assumed by the vector $\vec{G}$. The described arithmetic procedure must be executed for all $2M+1$ values of the index i in the focal kernel (i.e. for all discrete expressions of the transfer function caused which are due to the numerical, i.e. discrete, description of the temporal incoherence). When the number of values for M is taken as 3 (so the index i can assume 7 different values), the calculation time for the inventive estimation of an image of the defocus series is, therefore, of the order of magnitude of $(2M+1)(N.^2\log(N))=7.20.10^6=140.10^6$. (The calculation time required for the other operations in the expression (18) is negligibly short in comparison with the calculation time required for the FFTs). This value of the calculation time $(2M+1)(N.^2\log(N))$ must be compared with the value $N^2=10^{12}$ in accordance with the state of the art, revealing that in an iteration step during the estimation the calculation time has been reduced by a factor $N:\{(2M+1).^2\log(N)\}$ of the order of magnitude of $10^6:140=7000$.

The feedback step

Like in the state of the art, the feedback procedure of the invention concerns the derivation of the functions $\Delta\phi_n(\vec{G})$ from the functions $\Delta I_n(\vec{G})$.

For the formation of one of the functions $\Delta\phi_n(\vec{G})$ of the defocus series it is taken into account that the electron wave function $\psi_{n,i}(\vec{G})$ (in terms of the frequency vector $\vec{G}$) at the area of the image is formed by the product of the transfer function $p_{n,i}(\vec{G})$ and the electron wave function immediately behind the specimen $\phi(\vec{G})$ (see also the equation (15)): $\psi_{n,i}(\vec{G})=p_{n,i}(\vec{G})\times\phi(\vec{G})$. (This holds for each time one transfer function $p_{n,i}(\vec{G})$ due to the temporal incoherence, so that the index i appears in this equation. The variable $p_{n,i}(\vec{G})$ concerns the transfer function associated with the focus setting $f_n+i\epsilon$. The index n indicates the nominal experimental focus setting $f_n$ considered; the index i in this case indicates the $i^{th}$ point in the focal kernel centred around the nominal focus n.) By applying the inverse Fourier transform $(FT)^{-1}$ to $\psi_{n,i}(\vec{G})$ there is obtained $\psi_{n,i}(\vec{R})$: $\psi_{n,i}(\vec{R})=(FT)^{-1}\{\psi_{n,i}(\vec{G})\}$. In conformity with the rule of the MAL principle applied to image modelling in terms of focalling averaging for temporal incoherence, the product $\Delta I_n(\vec{R})\times\psi_{n,i}(\vec{R})$ is now formed, which product is subsequently subjected to Fourier transformation: $FT\{\Delta I_n(\vec{R})\times\psi_{n,i}(\vec{R})\}$; the latter expression (having become a function of the frequency vector $\vec{G}$ again due to the Fourier transformation) is then multiplied (again in conformity with the MAL rule) by the complex conjugate $p^*_{n,i}(\vec{G})$ of the transfer function $p_{n,i}(\vec{G})$:$p^*_{n,i}(\vec{G})\times FT\{\Delta I_n(\vec{R})\times\psi_{n,i}(\vec{R})\}$. The desired function $\Delta\phi_n(\vec{G})$ is then found by summing all contributions of the individual contributions (having index i) of the temporal incoherence with the associated weighting factor $g_i$ obtained from the normal focal distribution:

$$\Delta\phi_n(\vec{G}) = \sum_i g_i \times p_{n,i}^*(\vec{G}) \times FT\{\Delta I_n(\vec{R}) \times \psi_{n,i}(\vec{R})\} \quad (19)$$

The above expression (19) in accordance with the invention takes the place of the expression (13) known from the state of the art. When the feedback procedure for the correction of the electron wave function at the area of the specimen is to be executed in the described manner, numerical integration will have to be applied, like in the state of the art. To this end, for each value of $\vec{R}$ the expressions $\Delta I_n(\vec{R})$ and $\psi_{n,i}(\vec{R})$ must be determined and subsequently multiplied 1:1. For an image comprising N=1000×1000 pixels, the vector $\vec{R}$ has $10^6$ values, so that the latter 1:1 multiplication must be performed $10^6$ times. A Fourier transformation FT must then be applied to the remit of the multiplication. The core of the difference with respect to the state of the art (utilizing the TCC) consists in that the weighted correlation integral in accordance with the expression (13) (weighted by the TCC) is replaced in the expression (19) by the discrete sum of pure correlation integrals which can be calculated by means of FFTs in known manner. In the same way as demonstrated for the estimation step, it appears that for the feedback procedure for the correction of the electron wave function at the area of the specimen the calculation time required in accordance with the invention, being proportional to $(2M+1)(N.^2\log(N))$ must be compared with the calculation time of the state of the art, involving the TCC, which is proportional to $N^2$; it again appears that for the numerical example considered, where M=3 and N=$10^6$, the calculation time has been reduced by a factor of the order of magnitude of 7000.

The effect of the spatial incoherence of the illuminating beam

In the expressions (12) (for the estimation step) and (13) (for the feedback step), only the envelope function $E_{fs}$ occurs for the temporal incoherence in the transmission cross-coefficient TCC. As has already been stated, notably in the case of thermionic electron sources there is the effect of the spatial incoherence, which means that due to the spatial expansion of the source, the wave fronts in the illuminating beam do not extend in parallel but in different directions in dependence on the point of origin on the emissive surface of the source. As has already been stated, in the state of the art this causes the appearance of an additional envelope function $E_{so}$ in the transmission cross-coefficient.

In accordance with the invention the spatial incoherence can be taken into account as follows. The emissive surface of the electron source is assumed to be subdivided into a number of regions (for example, 5), each region being considered as a sub-source at the area of the centre of gravity of the relevant region, without spatial incoherence. The described procedure for the estimation and the feedback is then performed each time separately for each of the sub-sources, using separate, each time different transfer functions for each sub-source. The contributions from the sub-sources are summed during the formation of the estimate of the series of images of the specimen and during the formation of the sub-correction waves (during the feedback process) in order to obtain the resultant series of images or the resultant sub-correction waves. Even though the calculation time then increases in proportion to the increased number of sub-sources, a considerable gain is still achieved in comparison with the state of the art; in the previously assumed numerical example, in which a gain by a factor 7000 was achieved, the gain still amounts to 7000:5=1400 when 5 sub-sources are assumed.

The expression (18), in which only the temporal incoherence is taken up, becomes the following expression when the spatial incoherence is taken up:

$$I(\vec{R}) = \sum_{i,j} g_i h_j |(FT)^{-1}\{p_{i,j}(\vec{G}) \times \phi(\vec{G})\}|^2 \quad (20)$$

in which $\vec{j}$ is the position vector on the emissive surface of the effective source, $h_{\vec{j}}$ *is one factor of the set of weighting factors associated with the spatial incoherence,* and $p_{i,\vec{j}}$ is one function of the set of transfer functions in which the spatial incoherence is also taken into account.

Furthermore, when the spatial incoherence is taken into account, the expression (19) becomes:

$$\Delta\phi_n(\vec{G}) = \sum_{i,j} g_i h_{\vec{j}} \times p_{n,i,\vec{j}}^*(\vec{G}) \times FT\{\Delta I_n(\vec{R}) \times \psi_{n,i,\vec{j}}(\vec{R})\} \quad (21)$$

in which $\psi_{n,i,\vec{j}}(\vec{G})$ is one function of the set of electron wave functions at the area of the image in which the spatial incoherence has also been taken into account via the index vector Further embodiments of the invention The first simulation of the illuminating particle wave immediately behind the specimen can be selected in an arbitrary manner and the iterative operations can be performed on the basis thereof. For example, it would be feasible to select this first simulation of the illuminating particle wave (being a complex wave) in such a manner that the intensity (i.e. the amplitude squared) of this wave equals the mean intensity in the experimental images, the phase of this wave having the same value for all pixels, for example zero. However, the process can be substantially accelerated by a suitable choice of the initial form of this wave.

The determination of a specimen wave in the latter manner, also known as the linear approach, is known per se from U.S. Pat. No. 5,134,288.

The invention is furthermore characterized in that a series of experimental images is formed, each time with a different setting of the focal distance around a setting for optimal focus. The setting for optimum focus may be the so-called "light focus" which minimizes the image delocalization across the image frequency range considered. For a field emission TEM this optimum focus may be substantially further under focus than with the conventional optimum focus setting in the standard HRTEM, i.e. the so-called Scherzer focus.

In case said imaging parameter is the focal distance, a preferred embodiment of the invention is characterized in that it comprises a procedure in conformity with steps referred hereinafter as parallelization.

The effect of the parallelization.

a. For the image estimation.

Utilizing the expression (17), the following holds for image estimation of the $n^{th}$ image of the defocus series:

$$I_n(\vec{R}) = \sum_i g_i I_{n,i}(\vec{R}) \qquad (22)$$

In this expression, $I_{n,i}(\vec{R})$ is the $i^{th}$ sub-image, calculated for the focus setting $f_n+i\epsilon$. Per $n^{th}$ image in the defocus series, 2M+1 sub-images must be calculated, so in total (2M+1)K sub-images for the K images in the defocus series, and hence also (2M+1)K Fourier transforms. Analysis shows that the focal distance $\epsilon_{exp}$ between two successive images in the experimental series must be of the same order of magnitude as $\epsilon$ in order to achieve a practical desired reconstruction accuracy. A substantial arithmetical advantage can be achieved when both values are deemed to be exactly equal, i.e. if $\epsilon_{exp}=\epsilon$. For the subimages it then holds that $I_{n,i}=I_{n+i,0}$ with $1 \leq n \leq K$ and $-M \leq i \leq +M$, so that the following holds for the image estimation of the $n^{th}$ image:

$$I_n(\vec{R}) = \sum_i g_i I_{n+i,0}(\vec{R}) \qquad (23)$$

The index n+i of the sub-image $I_{n+i,0}(\vec{R})$ then covers the range $-M+1 \leq n+i \leq K+M$ with a total of K+2M possible values. The number of different sub-images required to realise the image estimation for the total defocus series then equals K+2M instead of said previously mentioned number (2M+1)K. For M=3 and K=20, this results in a reduction factor amounting to $\{(2M+1)K\}/(K+2M)=140/26 \approx 5$. This gain as regards calculation time required is achieved in that each of the calculated sub-images $I_{n+i,0}(\vec{R})$ can now be used for the estimation of a plurality of images $I_n(\vec{R})$ of the defocus series, because the focal points in overlapping kernels are identical and hence lead to identical transfer functions and hence identical sub-images. This can be readily understood as follows. Upon image estimation of the $n^{th}$ image $I_n(\vec{R})$ the focal kernel is centred around the nominal focus n and the kernel points run from n–M to n+M. Upon image estimation of the $(n+1)^{th}$ image $I_{n+1}(\vec{R})$, the focal kernel is centred around the nominal focus n+1 and the kernel points run from n+1–M to n+1+M. Thus, an overlap of 2M–1 focal points occurs in the two focal kernels associated with two successive focal values.

b. For the feedback process

It follows from the expression (19) that the ultimate correction wave is given by $$\Delta\phi(\vec{G}) = (1/K) \sum_{n=1}^{K} \sum_{i=-M}^{+M} g_i \times p_{n,i}^*(\vec{G}) \times FT\{\Delta I_n(\vec{R}) \times \psi_{n,i}(\vec{R})\} \qquad (24)$$

For the calculation of the total correction wave, therefore, K(2M+1) Fourier transforms are required. In the above case where $\epsilon_{exp}=\epsilon$, it holds that $p_{n,i}(\vec{G})=p_{n+i,0}(\vec{G})$ and $\psi_{n,i}(\vec{R})=\psi_{n+i,0}(\vec{R})$, so that the expression (24) is rewritten as $$\Delta\phi(\vec{G}) = (1/K) \sum_{n=1}^{K} \sum_{i=-M}^{+M} g_i \times p_{n+i,0}^*(\vec{G}) \times FT\{\Delta I_n(\vec{R}) \times \psi_{n+i,0}(\vec{R})\} \qquad (25)$$

Interchanging the two sums and utilizing the new sum index m=n+i yields:

$$\Delta\phi(\vec{G}) = (1/K) \sum_{m=-M+1}^{K+M} p_m^*(\vec{G}) \times FT\left\{ \sum_{n=1}^{K} g_{m-n} \Delta I_n(\vec{R}) \times \psi_{m,0}(\vec{R}) \right\} \qquad (26)$$

It follows from the expression (26) that the number of Fourier transforms required for the calculation of the total correction wave is reduced to K+2M; this yields the same reduction factor as stated above for the image estimation.

Selection of the weighting factors $g_i$ in the focal kernel.

The method of the invention is also characterized in that it comprises further steps which result in a better approximation as will be explained hereinafter.

The expressions (18) and (19) have been realized by replacing the weighted (by TCC) correlation integrals in the corresponding expressions (12) and (13) of the state of the art by a finite set of pure correlation integrals. This set corresponds one-by-one to the points i=–M, . . . , +M of the focal kernel centred around the nominal focus $f_n$. In the mathematical description this means the rewriting of the envelope function $E_{fs}$ for the focal spread in the expression (11) as:

BRIEF DESCRIPTION OF THE DRAWINGS which is written in the numerical approach as:

$$E_{fs}(\vec{G}+\vec{G'},\vec{G}) = \sum_{m=-M}^{m=+M} g_m \exp\{-i\pi\lambda(m\delta\epsilon)[(\vec{G}+\vec{G'})^2 - \vec{G}^2]\} \qquad (28)$$

in which $g_m$ are the weighting factors associated with the focal kernel chosen. A first feasible manner of selecting the weighting factors $g_m$ consists in the equidistant sampling of the focal distribution function due to temporal incoherence as described in the section "The estimation step in the state of the art".

Other possibilities for the selection of the weighting factors $g_m$ consist in optimizing the deviation introduced in the envelope function $E_{fs}$ for the focal spread by the approximation (28) in a defined manner. One way is to minimize the maximum deviation occurring in the frequency range $|\vec{G}| \leq G_{max}$, in which $G_{max}$ is the maximum spatial frequency for which the approximation in accordance with the expression (28) is used. Mathematically speaking, this means that the following quantity:

$$MAX|E_{fs}(\vec{G}+\vec{G'},\vec{G}) - \Sigma_m g_m \exp\{-i\pi\lambda(m\delta\epsilon)[(\vec{G}+\vec{G'})^2 - \vec{G}^2]\}| \qquad (29)$$

is minimized at the area $\{|\vec{G}+\vec{G'}|<G_{max} \wedge |\vec{G'}|<G_{max}\}$, being the $L_\infty$ approach.

A second way consists in minimizing the mean RMS (root mean square) error in the frequency range $|\vec{G}| \leq G_{max}$, i.e. minimization of the following quantity:

$$\sqrt{<(E_{ft}(\vec{G}+\vec{G'},\vec{G'}) - \Sigma_m g_m \exp\{-i\pi\lambda(m\delta\epsilon)[(\vec{G}+\vec{G'})^2 - \vec{G'}^2]\})^2>} \quad (30)$$

The form <---> in the expression (30) signifies the determination of the mean value over the frequency range used up to $G_{max}$. This is referred to as the $L_2$ approach. It has been found that for an optimum choice of the focal step size of the focal kernel (the coherence step size) $L_2$, but notably $L_\infty$, produces a smaller deviation (up to one order of magnitude better) than the obvious choice of equidistant sampling of the focal distribution function due to temporal incoherence.

BRIEF DESCRIPTION OF THE FIGURES

These and other aspects of the invention will be apparent from and elucidated with reference to the embodiments described hereinafter.

In the drawings.

DETAILED DESCRIPTION OF THE PREFERRED EMBODIMENTS

Figure 1:
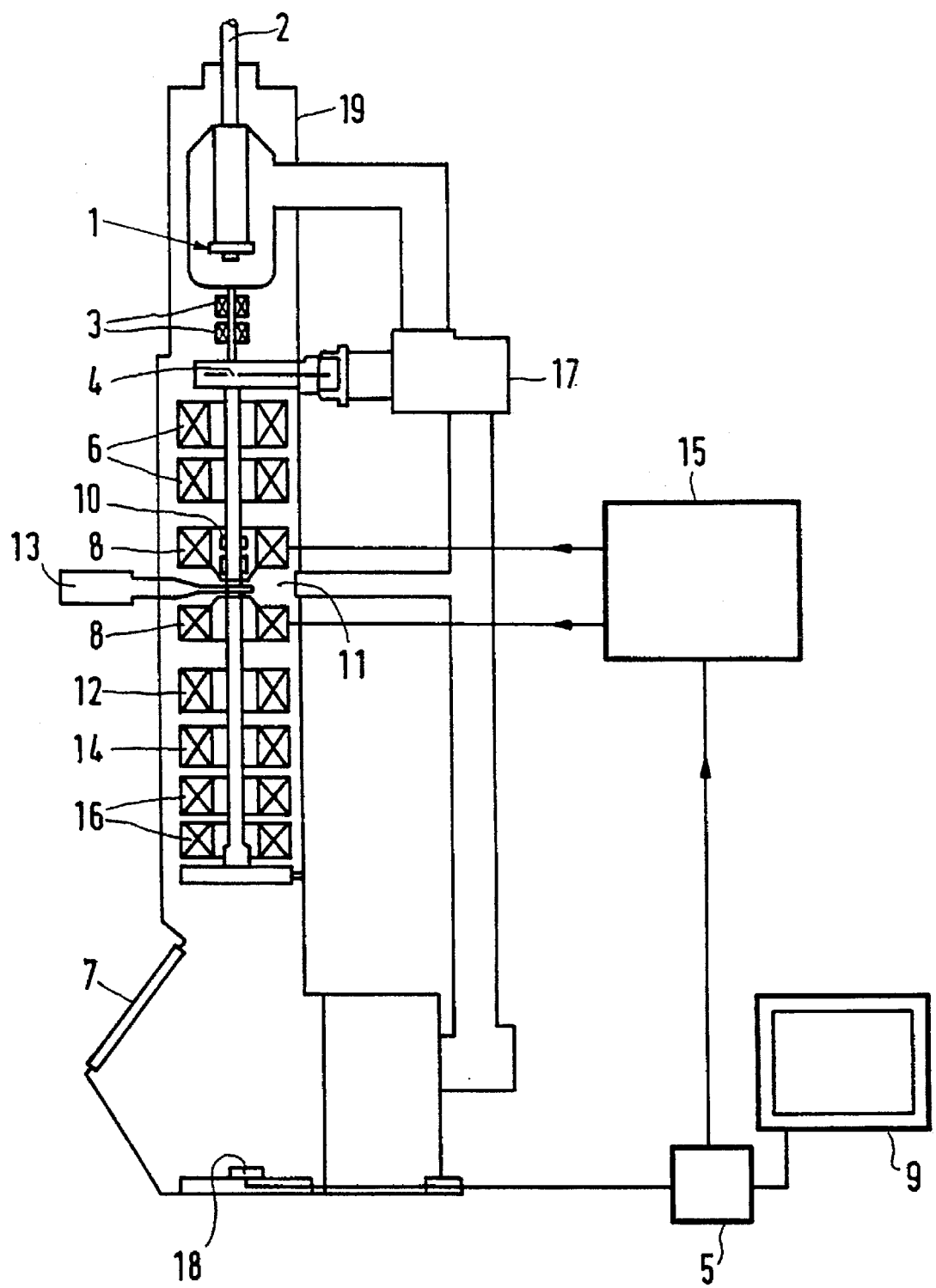
FIG. 1 shows an electron microscope whereby the invention can be carried out.

FIG. 1 shows a particle-optical apparatus in the form of an electron microscope. This apparatus comprises an electron source 1, a beam alignment system 3 and a beam diaphragm 4, a condenser lens 6, an objective lens 8, a beam scanning system 10, an object space 11 in which there is arranged a specimen carrier 13, a diffraction lens 12, an intermediate lens 14, a projection lens 16 and an electron detector 18. The objective lens 8, the intermediate lens 14 and the projection lens 16 together constitute an imaging lens system. These elements are accommodated in a housing 19 provided with an electric power supply lead 20 for the electron source, a viewing window 7 and a vacuum pumping device 17. The energizing coils of the objective lens 8 are connected to an energizing unit 15 which is arranged to energize the imaging lens system under the control of an electronic control and processing unit 5. The electron microscope also comprises a recording unit which includes the electron detector 18, an image processing unit which forms part of the control and processing unit 5, and a video display 9 for observation of the images formed.

Figure 2:
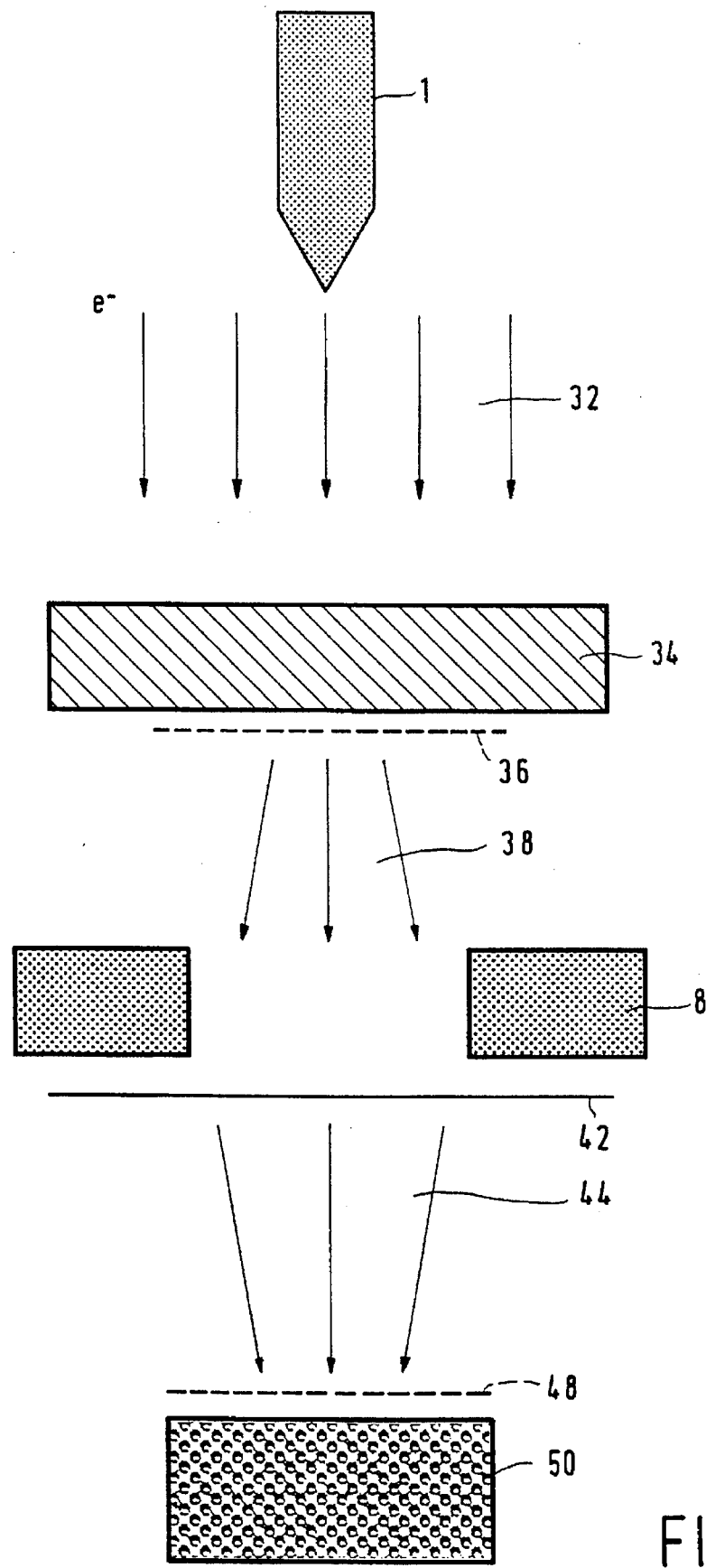
FIG. 2 shows a diagram illustrating the theory of the imaging in an electron microscope.

FIG. 2 is a diagram illustrating the theory of imaging by means of Fourier optics in an electron microscope. The electron source 1 emits an electron beam 32 which is diagrammatically denoted by parallel arrows. This source may in principle be any type of source, for example a field emission source (Field Emission Gun or FEG) or a thermionic source such as the known $LaB_6$ source. For the explanation of the principle it is assumed in this figure that the electron beam 32 is monochromatic and does not exhibit any temporal or spatial incoherence. The beam is incident on the specimen 34 so that the information as regards the microstructure thereof is present in the beam. Because of the wave nature of the electrons in the beam this information is described by means of the complex electron wave function $\phi(\vec{r})$ (the specimen wave) immediately behind the specimen, so at the area 36 in the figure. Herein, the position vector $\vec{r}$ indicates the location in the plane 36. The specimen wave $\phi(\vec{r})$ propagates as an electron wave 38 behind the specimen and is deflected further by the imaging lens system of the electron microscope (symbolically represented by the objective lens 8). Because the structure of the specimen causes diffraction of the (parallel) wave incident on the specimen, the back focal plane 42 of the objective lens 8 contains a diffraction pattern which constitutes a representation of the spatial frequencies present in the specimen 34 and represented by the frequency vector $\vec{G}$, in which $G=\theta/\lambda$, $\theta$=the diffraction deflection angle in the specimen, and $\lambda$=the wavelength of the electron wave; because the deflection can occur in two independent directions, G has a vector character: $\vec{G}$. Mathematically speaking this means that the specimen wave $\phi(\vec{r})$ in the real space is transformed, by Fourier transformation, into a specimen wave $\phi(\vec{G})$ in the frequency domain. The description of the transfer of the specimen wave from the specimen to the detector (not shown) at the area of the image 50 takes place in known manner by means of a (complex) transfer function $p(\vec{G})$ in the frequency domain in which the effect of lens errors is also taken into account. The imaging in the image plane 48 takes place by multiplication of the specimen wave $\phi(\vec{G})$ by the transfer function $p(\vec{G})$ associated with the relevant setting of the electron microscope. Thus, in the frequency domain the image wave $\psi(\vec{G})$ is obtained wherefrom, via an inverse Fourier transformation, the image wave $\psi(\vec{R})$ arises in the real space (the position vector $\vec{R}$ describes the position in the image plane 48). The amplitude squared of this wave constitutes the probability distribution of the location of the electrons in the beam at the area of the detector, so the image intensity $I(\vec{R})$ in the image plane 48, and hence the image 50 that can be observed by the detector.

Figure 3:
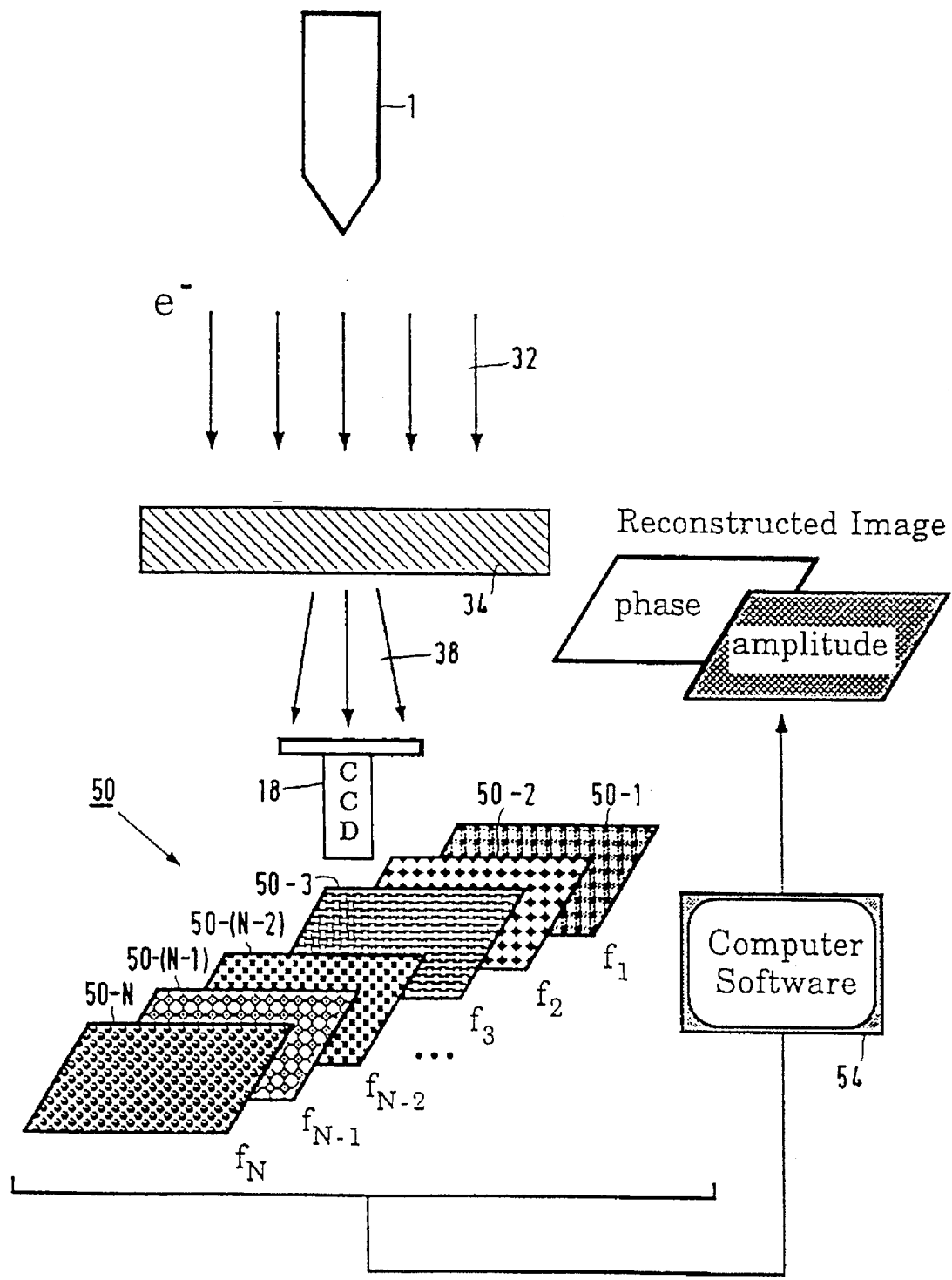
FIG. 3 shows a diagram illustrating the principle of the reconstruction by focus variation in an electron microscope.

FIG. 3 shows a diagram illustrating the principle of reconstruction by focus variation in an electron microscope. Like in FIG. 2, an electron beam 32 emitted by the electron source 1 traverses the specimen 34; using this beam, the imaging system (not shown) of the electron microscope forms an image 50 at the area of the detector 18. A number of images 50-1 to 50-N is made, each time with a different focal distance, by variation of an imaging parameter, notably the focal distance of the imaging objective lens. By calculation, preferably by means of a computer 54, the appearance of the specimen wave $\phi(\vec{r})$ immediately behind the specimen is determined in known manner from the defocus series. Thus, a resolution can be obtained which is below the limit value determined by the lens faults of the electron microscope, notably the spherical aberration.

Figure 4:
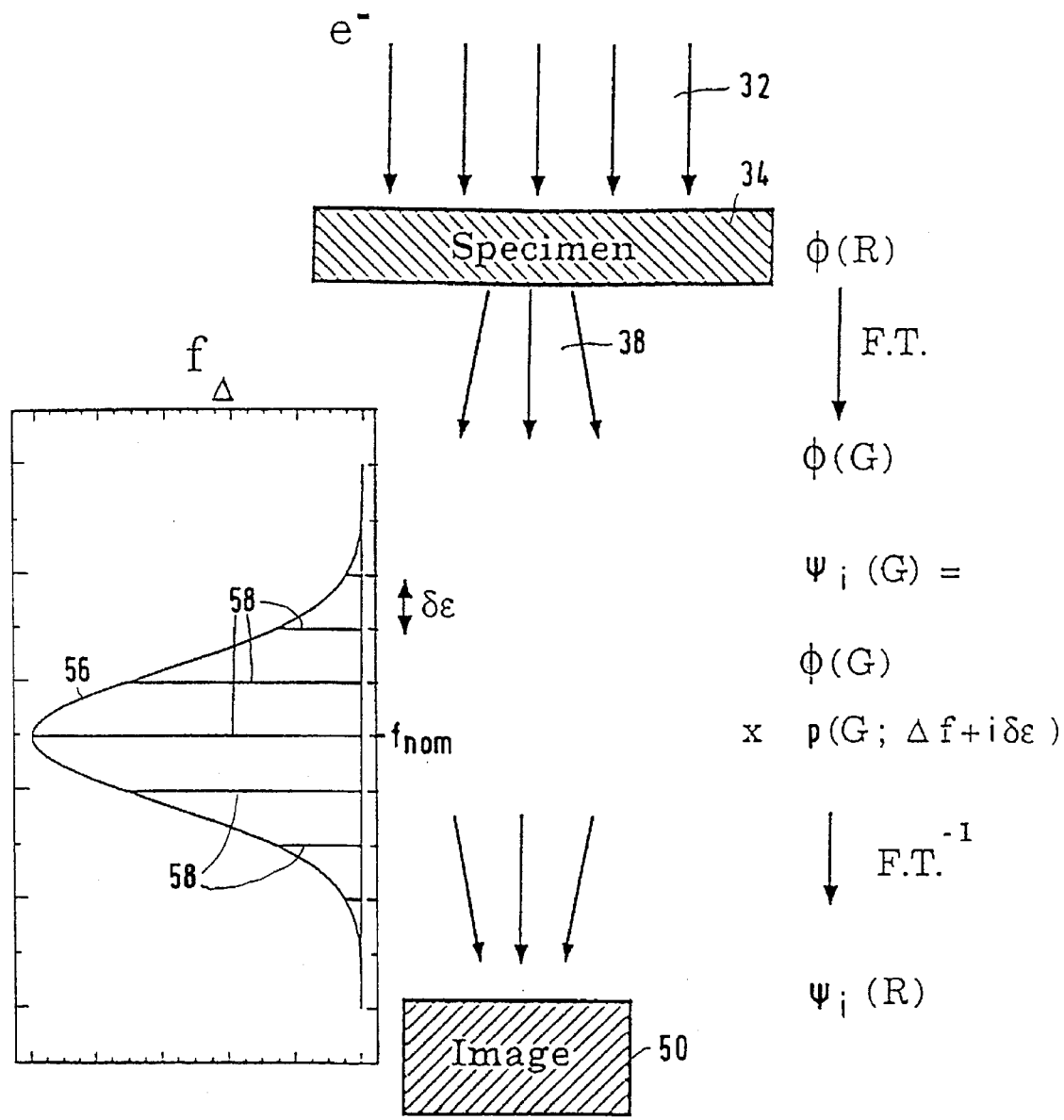
FIG. 4 shows a diagram illustrating the principle of the processing of the temporal incoherence in the imaging in the reconstruction in accordance with the invention.

FIG. 4 shows a diagram illustrating the principle of the processing of the temporal incoherence in the imaging in the reconstruction in accordance with the invention. As has already been described, the temporal incoherence in the electron microscope causes spreading of the focal distance which exhibits a normal distribution around the adjusted value of the focal distance. The image formed by the microscope is considered to be a weighted mean of a continuum of partial images. In the discrete approach, this weighted mean is replaced by a weighted sum of partial images, each of which is assumed to have resulted from the product of the specimen wave directly behind the specimen in the frequency domain $\phi(\vec{G})$ with each time a different transfer function $p_i(\vec{G})$ associated with the relevant defocus value. Because the effect of the various quantities on the focal distance is known, the spread thereof is also known. The weighting factors for the formation of the sum of partial images can then be calculated, assuming that the focal distances exhibit a normal (Gaussian) distribution.

FIG. 4 shows diagrammatically the situation of the focal points as a number of planes 58 with a given spacing $\delta \epsilon$ relative to the nominal focal plane $f_{nom}$; the situation of the focal planes is shown as a normal distribution 56 which is sampled with intervals $\delta \epsilon$. In the discrete approach, for each of the focal distances a partial image is formed with the associated transfer function $p_i(\vec{G})$, each time the wave function $\psi_i(\vec{G})$ being determined therefrom, said wave functions being added with said weighting factor. The imaging wave $\psi_i(\vec{R})$ is then obtained after inverse Fourier transformation.

Figure 5:
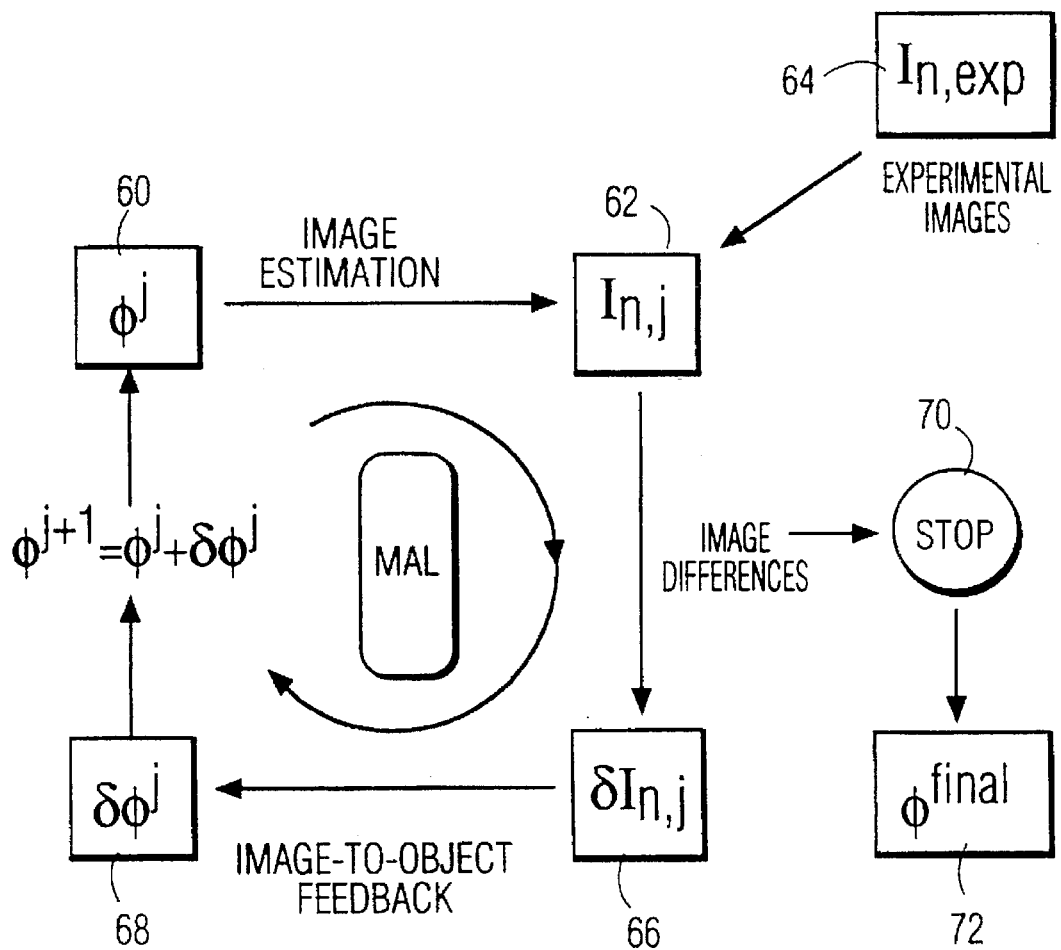
FIG. 5 shows a diagram illustrating the principle of the invention for the iterative reconstruction by estimation and feedback in an electron microscope.

FIG. 5 shows a diagram illustrating the principle of the invention concerning the iterative reconstruction by estimation and feedback in an electron microscope. In the electron microscope a series of images of the specimen to be studied is formed each time with a different setting of the focal distance of the imaging lens. This series of images, referred to as the defocus series, is denoted by the reference $I_{n,exp}$ in box 64 in the figure. In the estimation part of the iterative procedure a first assumption is made as regards the specimen wave $\phi(\vec{r})$ wherefrom a series of estimated images is determined by calculation, said images being denoted by the reference $I_{n,j}$ in box 62 in the figure. This calculation will be described in detail with reference to FIG. 6. In each iteration step the difference between the experimental defocus series and the estimated defocus series is determined. (See box 66 in which the difference is denoted by the reference $\delta I_{n,j}$.). The specimen wave is renewed for each iteration step (denoted by $\phi^j$ in box 60 in the figure, in which j denotes the $j^{th}$ iteration step) until the difference between the estimated images and the experimental images has become sufficiently small. The criterion regarding adequate correspondence of the two defocus series is determined on the basis of the mean square error MSE between the experimental images and the estimated images. When said difference $\delta I_{n,j}$ is sufficiently small, the iteration is stopped (box 70) and the specimen wave $\phi^{final}$ valid at that instant is considered to be the desired image of the specimen (box 72). When said difference $\delta I_{n,j}$ is not yet sufficiently small, a correction wave $\delta \phi^j$ is determined in the feedback part of the iterative procedure; for this purpose use is made of a known method, i.e. the so-called Maximum Likelihood (MAL) method (box 68) which corrects the version of the specimen wave $\phi^j$ then valid so as to obtain a new version $\phi^{j+1}$ of the specimen wave, after which a next iteration cycle may commence.

Figure 6A:
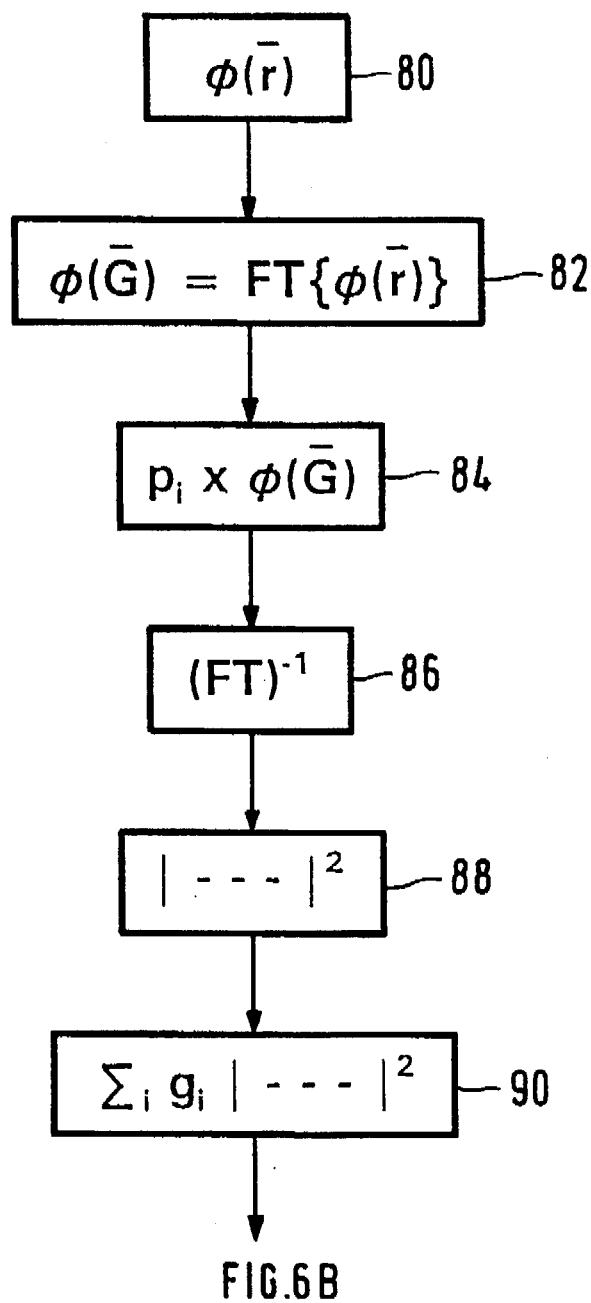
FIG. 6 shows a flow chart with the various steps of a complete calculation of the iterative reconstruction by estimation and feedback in accordance with the invention.
Figure 6B:
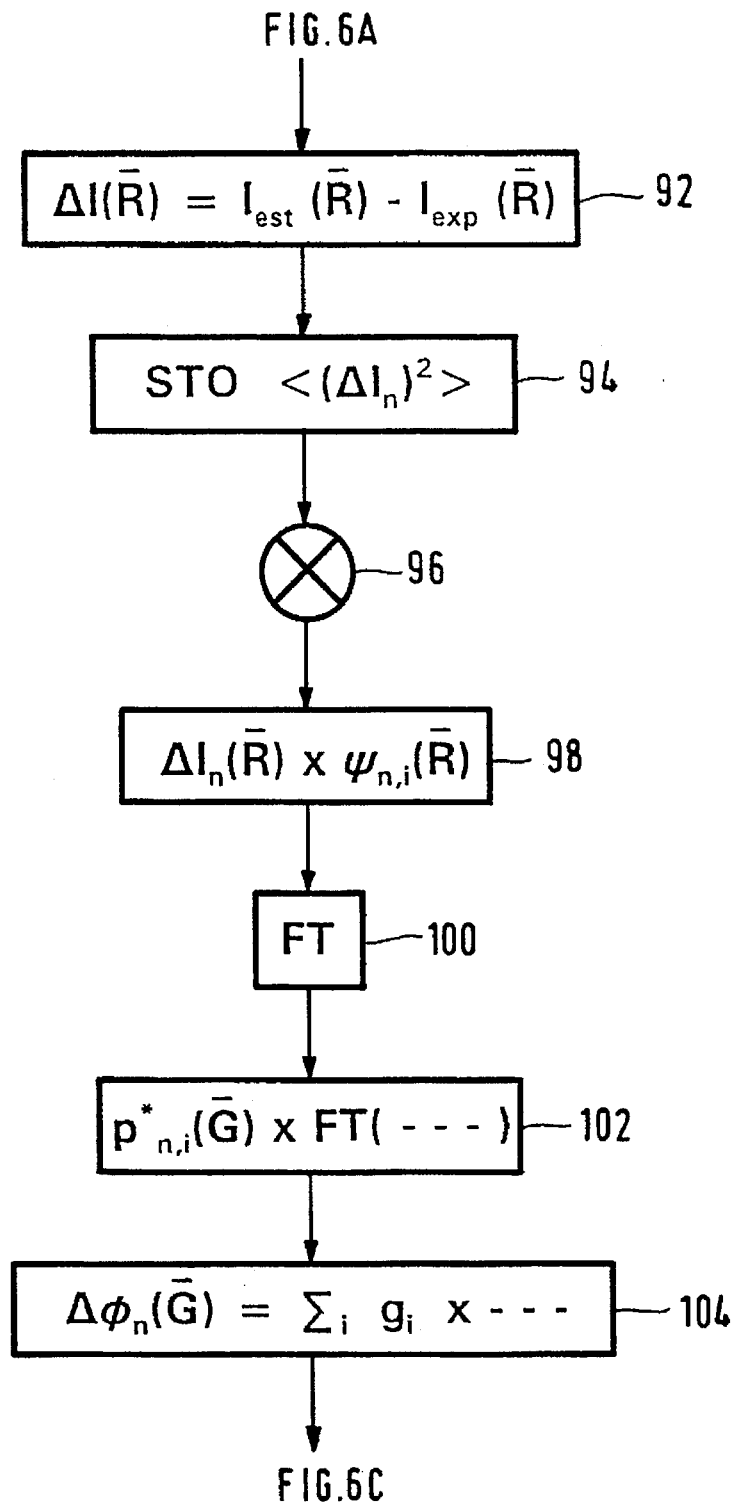
Figure 6C:
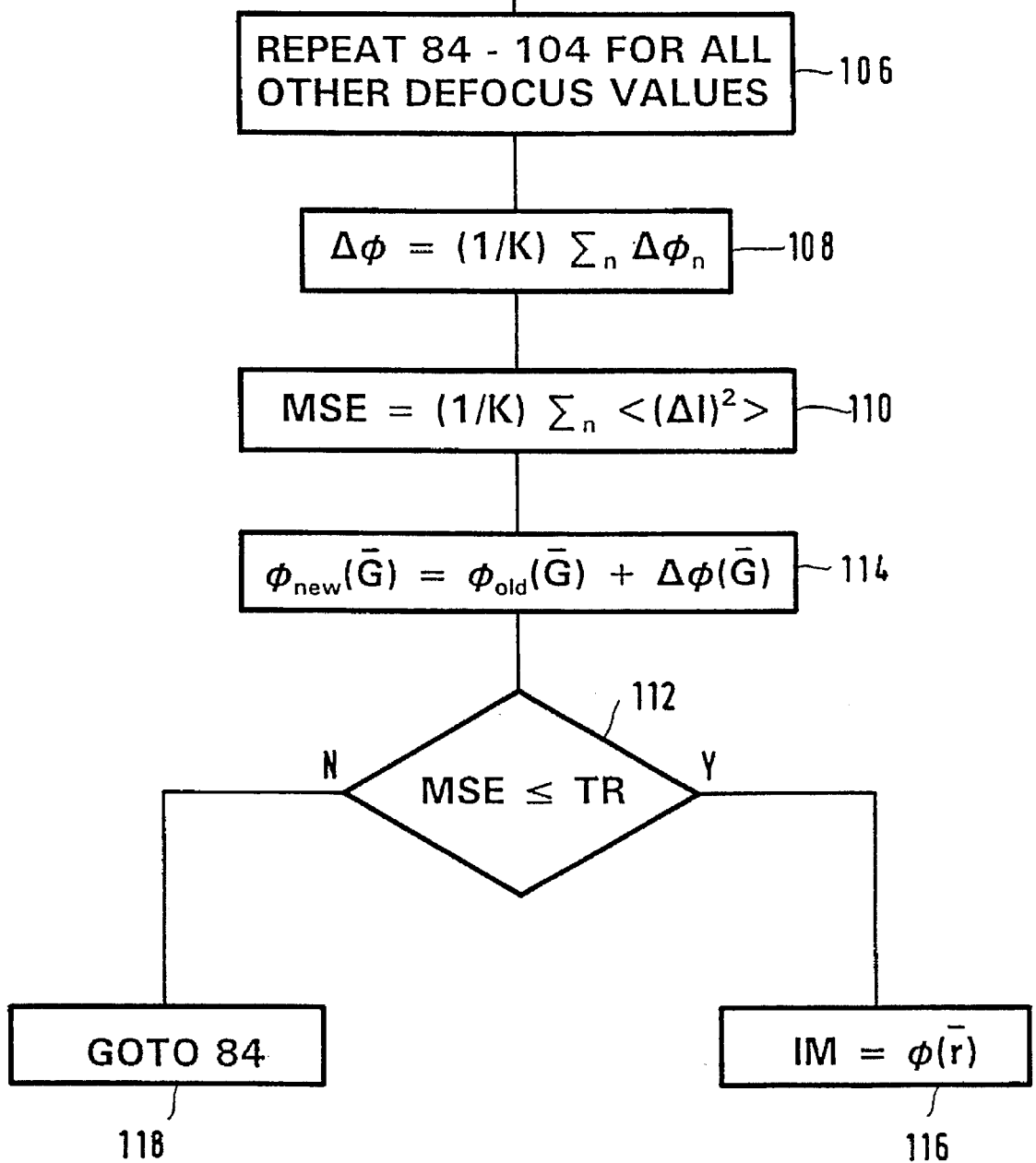

FIG. 6 shows a flow chart illustrating the various steps of a complete calculation of the iterative reconstruction by estimation and feedback in accordance with the invention. The estimation part of the procedure in accordance with the invention is described by the expression (18) and the feedback part by the expression (19).

In conformity with the expression (18), the reconstruction commences with the assumption of a complex specimen wave $\phi(\vec{r})$ immediately behind the specimen (box 80). The specimen wave can be obtained in known manner, for example as described in U.S. Pat. No. 5,134,288. It is assumed that the desired sampling of the image is $N=10^3 \times 10^3=10^6$ pixels. In that case the numerical representation of the specimen wave consists of $10^6$ complex numbers or $2N=2\times 10^6$ real numbers. This representation of the specimen wave in real space is first converted by Fourier transformation into a corresponding specimen wave $\phi(\vec{G})$ in the frequency domain (box 82). The numerical version of a Fourier transformation applied to the numerical representation $\phi_{i,j}$ of the specimen wave $\phi(\vec{r})$ (in which the position vector $\vec{r}$ has thus been replaced by the pair of location indices i,j) is as follows:

$$\tilde{\phi}_{k,l} = \left( \frac{1}{N^2} \right) \sum_{i=0}^{N-1} \sum_{j=0}^{N-1} \phi_{i,j} \exp\left( -2\pi i \frac{ki+lj}{N} \right) \quad (31)$$

in which $N^2$ is the number of pixels. ($\tilde{\phi}_{k,l}$ indicates that this is a Fourier-transformed quantity.) The expression (31), representing a two-dimensional Fourier transformation, can be rewritten as the product of two one-dimensional Fourier transformations:

$$\tilde{\phi}_{k,l} = \quad (32)$$

$$\left( \frac{1}{N} \right) \sum_{i=0}^{N-1} \left[ \exp\left( -2\pi i \frac{ki}{N} \right) \left\{ \left( \frac{1}{N} \right) \sum_{j=0}^{N-1} \phi_{i,j} \exp\left( -2\pi i \frac{lj}{N} \right) \right\} \right]$$

Each of the two terms in the expression (32) then corresponds to a one-dimensional Fourier transformation; the expression:

$$\tilde{\phi}_k = \frac{1}{N} \sum_{j=0}^{N-1} \phi_j \exp\left( -2\pi i \frac{jk}{N} \right) \quad (33)$$

which follows therefrom can be calculated by way of fast Fourier transformation FFT). For each element k of the one-dimensional transform (33), therefore, the contribution from all $j=10^3$ elements is necessary. This operation must be executed for all values of k, so $10^6$ times. Because a number of terms of the transform (33) can be used a number of times when using FFTs, the calculation time is not proportional to $N^2$ as could be expected, but proportional to $N.^2\log(N)$ in conformity with the properties of the FFTs. The result of the Fourier transformation in conformity with box 82 is a numerical representation of the specimen wave in the frequency domain in the form of a matrix of $10^3 \times 10^3$ complex numbers, so $2\times 10^6$ real numbers.

From the specimen wave $\phi(\vec{G})$ the electron wave function $\psi_i(\vec{G})$ at the area of the detector is calculated (in terms of the frequency vector $\vec{G}$) by multiplication by the transfer function $p_i(\vec{G})$ (box 84). The transfer function of a particle-optical apparatus, such as an electron microscope, is determined in known manner. As described before, this transfer function is valid for one given value of the focal distance in the defocus series and for one given value of the defocus caused by the temporal incoherence. If the effect of the spatial incoherence is taken into account, this function is also valid for only one of the subsources forming part of the real electron source. The numerical representation of the transfer function $p_i(\vec{G})$ consists of $10^6$ complex numbers in the present numerical example. The multiplication as indicated in box 84 is a 1:1 multiplication, i.e. each element $\phi_{k,l}$ of the electron wave function $\phi(\vec{G})$ is multiplied by the corresponding element $p_{i,k,l}$ of the transfer function $p_i(\vec{G})$. If it is assumed that the spread in the defocus values due to the temporal incoherence can be numerically represented by 7 discrete values, the 1:1 multiplication must be executed 7 times, so that the index i of the transfer function $p_i(\vec{G})$ runs from i=−3 to i=+3 in steps of 1. The result of the multiplication according to the box 84 is formed by the numerical representation of 7 electron wave functions $\psi_{-3}(\vec{G})$ to $\psi_{+3}(\vec{G})$ at the area of the detector in the form of 7 matrices of $10^6$ complex numbers each.

Each of the electron wave functions $\psi_i(\vec{G})$ is then subjected to an inverse Fourier transformation (box 86). The inverse Fourier transformation is executed in a manner which is comparable to that of the Fourier transformation in conformity with the expression (28) as described with reference to the box 82, be it that the following differences exist:

1) the signs in the exponents are replaced by the opposite sign, and
2) the factor $1/N^2$ (i.e. $1/N \times 1/N$) is omitted.

The result of the inverse Fourier transformation according to box 86, performed on the 7 electron wave functions $\psi_i(\vec{G})$, is formed by 7 electron wave functions $\psi_i(\vec{R})$ in the form of 7 matrices of $10^6$ complex numbers each.

From each of the 7 electron wave functions $\psi_i(\vec{R})$ the associated partial image $I_i(\vec{R})$ is determined by multiplying each element of said 7 matrices by its complex conjugate (box 88). 7 matrices of $10^6$ real numbers each are thus formed.

The 7 partial images $I_i(\vec{R})$ determined in box 88 are combined, by one-to-one addition with the associated weighting factors $g_i$, so as to form the final image $I(\vec{R})$ (box 90). As has already been stated with reference to the expression (18), the image $I(\vec{R})$ is merely the estimation of one of the images of the defocus series. This image, therefore, should actually be reproduced with an index n: $I_n(\vec{R})$, where n may assume a value from 1 to K, K being 20 in the numerical example used.

In box 92 one-to-one subtraction is applied to determine the difference image $\Delta I_n(\vec{R})$ between the estimated image $I_{n,est}(\vec{R})$ and the experimental image $I_{n,exp}(\vec{R})$, all concerning the $n^{th}$ item of the defocus series. The difference image $\Delta I_n(\vec{R})$ is used to make a contribution so as to carry out a test whether or not the approximation criterion on the basis of which the iterations can be stopped has been satisfied. To this end, the quantity MSE=$<(\Delta I_n)^2>$ is formed (box 94); therein, MSE is the mean value of the mean square error MSE in conformity with the calculation rule MSE=$(1/10^6)\Sigma_{i,j}|\Delta I_{i,j}|^2$. The quantity MSE thus determined is the value which follows from one image of the defocus series; because the sum of the MSEs of all images is required for the comparison with the approximation criterion, this individual MSE is stored ("STO<$(\Delta I_n)^2$>") so as to be added to the closer MSEs. Moreover, the entire matrix of integer numbers representing the difference image $\Delta I_n(\vec{R})$ is stored because, as will be described in detail hereinafter, it is used again in the feedback part of the iterative operation as is already apparent from the expression (19).

Finally, the symbol denoted by the reference numeral 96 indicates that the end of the estimation step of the $n^{th}$ defocus image has been reached. It would be feasible to repeat the described steps for all images of the defocus series, so that at the end of the estimation procedure all estimated images would be available. However, this would require an excessively large memory capacity. Therefore, using the difference image $\Delta I_n(\vec{R})$ determined in box 92, first the feedback procedure is executed in order to form the sub-correction wave $\Delta\phi_n(\vec{G})$ associated with the relevant defocus image n.

The feedback part of the procedure in accordance with the invention is described by the expression (19). In conformity with this expression, first the product $\Delta I_n(\vec{R}) \times \psi_{n,i}(\vec{R})$ must be formed (box 98). As has been described with reference to box 92, the matrix representing $\Delta I_n(\vec{R})$ ($10^6$ real numbers) has already been calculated, whereas the electron wave function $\psi_{n,i}(\vec{R})$ at the area of the detector ($10^6$ complex numbers) has already been calculated as described with reference to box 86.

A Fourier transformation is applied (box 100) to the result of the box 98 ($10^6$ complex numbers), which Fourier transformation is executed completely as described with reference to the box 82.

The result of the operation in box 100 is multiplied 1:1 by the complex conjugate $p^*_{i,k,l}$ of the transfer function $p_{i,k,l}$ (box 102). The latter function has already been calculated as described with reference to box 84. For the execution of box 102, therefore, only the complex conjugate need be calculated (which implies merely the reversal of the sign of the imaginary part of the relevant complex numbers) and a one-to-one multiplication must be performed. The operation in conformity with the boxes 98, 100 and 102 is performed for all values of i, so 7 times in total. The result is formed as 7 matrices of $10^6$ complex numbers each.

The 7 complex matrices determined in box 102 are combined, by one-to-one addition with the associated weighting factors $g_i$, so as to form the sub-correction wave $\Delta\phi_n(\vec{G})$ (box 104).

As has already been mentioned with reference to box 96, the described procedure has been performed for one image of the defocus series only. For the determination of the ultimate correction wave $\Delta\phi_n(\vec{G})$, the estimation procedure as well as the feedback procedure must be executed for all images of the defocus series (box 106). Finally, this results in K (K=20) partial correction waves $\Delta\phi_n(\vec{G})$ which are combined, via a one-to-one addition $\Delta\phi(\vec{G})=(1/K)\Sigma_n\Delta\phi_n(\vec{G})$, so as to form the desired correction wave $\Delta\phi(\vec{G})$ (box 108).

The quantities $<(\Delta I_n)^2>$, described with reference to box 94 and associated with a respective one of the images of the defocus series, are added so as to form the ultimate quantity MSE after division by K (box 110).

Using the correction wave $\Delta\phi(\vec{G})$ obtained in box 108 the specimen wave assumed at the beginning of the last iteration cycle (denoted by $\phi_{old}(\vec{r})$ for this case) is corrected so as to obtain a new specimen wave (denoted by $\phi_{new}(\vec{r})$ for this case) via the addition $\phi_{new}(\vec{G})=\phi_{old}(\vec{G})+\gamma\Delta\phi(\vec{G})$ (in which $\gamma$ is the already mentioned feedback parameter) (box 114).

The value formed for MSE in the box 110 is compared with a predetermined threshold value (box 112) which constitutes the approximation criterion on the basis of which it is determined whether the iterations are to be continued or terminated. If the value of MSE is below the threshold value so that the iterations are terminated, the specimen wave $\phi_{new}(\vec{r})$ found in the box 114 is considered to be the desired representation of the specimen to be studied (box 116).

If the value of MSE exceeds the threshold value, the iterations are continued. The specimen wave $\phi_{new}(\vec{r})$ found in the box 114 can then start a new cycle (box 118).

We claim:

1. A method for iterative formation of an image of a specimen to be studied in a particle-optical apparatus on the basis of a series of experimental images (the experimental series), each of which is recorded with a respective different value of at least one imaging parameter, which method comprises the steps of:

a) determining a simulation of the illuminating particle wave directly behind the specimen (the specimen wave);

b) determination of an estimation of a series of images of the specimen (the estimated series), in which series said imaging parameter has each time said respective different value, said determination being executed by processing in the frequency domain on said simulation of the specimen wave while utilizing a function of the particle-optical apparatus, which function represents transfer properties in the frequency domain of the apparatus;

c) forming respective differences between the estimation of said images and corresponding experimental images of the specimen to be studied;

d) carrying out a test as to whether said differences satisfy a predetermined approximation criterion, which test may have a first or a second test result;

e) first forming sub-correction waves, in dependence on the first test result, by executing in the frequency domain, for each image of the series of images, an operation on said difference while utilizing the function of the particle-optical apparatus which is associated with said image and which represents the transfer properties in the frequency domain of the apparatus, and subsequently forming a correction wave by addition of the individual sub-correction waves and the subsequent correction of the simulation of the specimen wave by means of the correction wave thus obtained;

f) repeating the above steps a) to e) in dependence on the first test result;

g) terminating the iterative operation in dependence on the second test result; wherein in each iteration step of the iterative operation for each image $I_n(\vec{R})$ of the experimental series:

the function of the particle-optical apparatus representing transfer properties in the frequency domain ($\vec{G}$) of the apparatus is formed by the transfer function $p_n(\vec{G})$ of the apparatus;

a set of such transfer functions is defined, each item $p_{n,i}(\vec{G})$ of the set corresponding to a respective different set of values of imaging parameters leading to incoherence; a set of sub-image waves $\psi_{n,i}(\vec{R})$ is formed in real space by multiplying said simulation of the specimen wave $\phi(\vec{G})$ in the frequency domain ($\vec{G}$) by each time a different item $p_{n,i}(\vec{G})$ of the set of transfer functions, and by subjecting the product $\psi_{n,i}(\vec{G})$ to an inverse Fourier transformation;

in which during the estimation a set of sub-images $I_{n,i}(\vec{R})$ is formed at the area of the detector in the real space ($\vec{R}$) from the modulus squared of each of said sub-image waves $|\psi_{n,i}(\vec{R})|^2$ in the real space ($\vec{R}$), and the estimation of each item $I_n(\vec{R})$ of the estimated series is formed as the weighted sum $\Sigma_i g_i I_{n,i}(\vec{R})$ of the sub-images $I_{n,i}(\vec{R})$ with a weighting factor $g_i$ obtained from the spread of said imaging parameters leading to incoherence;

a series of difference images $\Delta I_n(\vec{R})$ is formed by subtracting the estimation of each item of the series of images $I_n(\vec{R})$ at the area of the detector from the corresponding item of the experimental series; each item of the series of difference images $\Delta I_n(\vec{R})$ is multiplied by an associated item of the set of sub-image waves $\psi_{n,i}(\vec{R})$ in the real space, after which the product thus formed is subjected to a Fourier transformation;

a set of intermediate products is obtained by multiplying each item of the series of the products $FT\{\Delta I_n(\vec{R}) \times \psi_{n,i}(\vec{R})\}$ thus Fourier transformed by the complex conjugate of an associated item $p_{n,i}(\vec{G})$ of the set of transfer functions;

each sub-correction wave $\Delta\phi_n(\vec{G})$ is formed as the weighted sum $\Sigma_i g_i \times p^*_{n,i}(\vec{G}) \times FT\{\Delta I_n(\vec{R}) \times \psi_{n,i}(\vec{R})\}$ of intermediate products with the weighting factor $g_i$ obtained from the spread of said imaging parameters leading to incoherence.

2. A method as claimed in claim 1, wherein in the iterative process the first simulation of the illuminating particle wave directly behind the specimen is obtained by:

multiplication in the frequency domain of each item of said number of experimental images by an associated filter function which selects the linear imaging contribution from each of the experimental images, said filter function forming a correction for the transfer function valid for the relevant image, and addition of the products thus obtained for all experimental images.

3. A method as claimed in claim 1, wherein the imaging parameter whose setting is changed each time so as to record said number of experimental images is the angle at which the illuminating beam passes through the imaging lens.

4. A method as claimed in claim 1, wherein the imaging parameter whose setting is changed each time so as to record said number of experimental images is the focal distance of the imaging lens.

5. A method as claimed in claim 4, wherein during the recording of said number of experimental images the focal distance is varied with a constant step size (the focus step size), each time a different set of values of imaging parameters leading to temporal incoherence, for which each time an item $p_i(\vec{G})$ of the set of transfer functions is defined, is chosen in such a manner that the focal distance associated with each item of said each time different set of values is varied with a constant step size (the coherence step size), and the focus step size and the coherence step size are equally large.

6. A method as claimed in claim 4, wherein the weighting factors $g_i$ occurring due to a spread in the focal distance of the imaging lens which is caused by temporal incoherence are chosen by application of a minimalization procedure where the quantity to be minimized is formed by the maximum absolute deviation between the analytic envelope function in the transmission cross-coefficient, determined by temporal incoherence, and the form determined by means of said weighting factors.

7. A method as claimed in claim 4, wherein the weighting factors $g_i$ occurring due to a spread in the focal distance of the imaging lens which is caused by temporal incoherence are chosen by application of a minimalization procedure in which the quantity to be minimized is formed by the root mean square deviation between the analytic envelope function, in the transmission cross-coefficient, determined by temporal incoherence and the form determined by means of said weighting factors.

8. A particle-optical apparatus, comprising:
   a) means for recording a series of experimental images (the experimental series), each of which is recorded with a respective different setting of at least one imaging parameter;
   b) means for determining a simulation of the illuminating particle wave directly behind the specimen (the specimen wave);
   c) means for determining an estimation of a series of images, in which series said imaging parameter has each time said respective different value, said determination being executed on said simulation of the specimen wave while utilizing a function of the particle-optical apparatus, which function represents transfer properties in the frequency domain of the apparatus;
   d) means for forming respective differences between the estimation of said images and corresponding experimental images of the specimen to be studied;
   e) means for carrying out a test as to whether said difference satisfies a predetermined approximation criterion, which test may have a first or a second test result;
   f) means for forming, in dependence on the first test result, sub-correction waves by executing, in the frequency domain, for each image of the series of images, an operation on said difference while utilizing the function of the particle-optical apparatus which is associated with said image and which represents the transfer properties in the frequency domain of the apparatus, followed by formation of a correction wave by addition of the individual sub-correction waves and the subsequent correction of the simulation of the specimen wave by means of the correction wave thus obtained;
   g) means for repeating the above steps b) to f) in dependence on the first test result;
   h) means for terminating the iterative operation in dependence on the second test result; characterized in that the particle-optical apparatus also comprises means in which during each iteration step of the iterative operation the following operations can be performed for each item $I(\vec{R})$ of the experimental series:
      forming the function of the particle-optical apparatus which represents the transfer properties in the frequency domain $(\vec{G})$ of the apparatus by the transfer function $p(\vec{G})$ of the apparatus;

defining a set of such transfer functions, each item $p_i(\vec{G})$ of the set corresponding to a respective different set of values of imaging parameters leading to incoherence;

forming a set of sub-image waves $\psi_i(\vec{R})$ in real space by multiplying said simulation of the specimen wave $\phi(\vec{G})$ in the frequency domain $(\vec{G})$ by each time a different item $p_i(\vec{G})$ of the set of transfer functions, and by subjecting the product $\psi_i(\vec{G})$ to an inverse Fourier transformation;

a set of sub-images $I_i(\vec{R})$ is formed at the area of the detector in the real space $(\vec{R})$ from the modulus squared of each of said sub-image waves $|\psi_i(\vec{R})|^2$ in the real space $(\vec{R})$; and the estimation of each item $I(\vec{R})$ of the estimated series is formed as the weighted sum $\Sigma_i\, g_i\, I_i(\vec{R})$ of the sub-images $I_i(\vec{R})$ with a weighting factor $g_i$ obtained from the spread of said imaging parameters leading to incoherence;

a series of difference images $\Delta I(\vec{R})$ is formed by subtracting the estimation of each item of the series of images $I(\vec{R})$ at the area of the detector from the corresponding item of the experimental series;

each item of the series of difference images $\Delta I(\vec{R})$ is multiplied by an associated item of the set of sub-image waves $\psi_i(\vec{R})$ in the real space, after which the product thus formed is subjected to a Fourier transformation;

a set of intermediate products is obtained by multiplying each item of the series of the products $FT\{\Delta I_n(\vec{R})\times\psi_{n,i}(\vec{R})\}$ thus Fourier transformed by the complex conjugate of an associated item $p_i(\vec{G})$ of the set of transfer functions;

each sub-correction wave $\Delta\phi_n(\vec{G})$ is formed as the weighted sum $\Sigma_i\, g_i\times p^*_{n,i}(\vec{G})\times FT\{\Delta I_n(\vec{R})\times\psi_{n,i}(\vec{R})\}$ of intermediate products with the weighting factor $g_i$ obtained from the spread of said imaging parameters leading to incoherence.

9. A particle-optical apparatus as claimed in claim 8, wherein the apparatus comprises means in which during the iterative process the first simulation of the illuminating particle wave directly behind the specimen is obtained by multiplication in the frequency domain of each item of said number of experimental images by an associated filter function which selects the linear imaging contribution from each of the experimental images, said filter function forming a correction for the transfer function valid for the relevant image, and addition of the products thus obtained for all experimental images.

10. A particle-optical apparatus as claimed in claim 8, wherein the apparatus comprises means in which the imaging parameter whose setting is changed each time so as to record said number of experimental images is the angle at which the illuminating beam passes through the imaging lens.

11. A particle-optical apparatus as claimed in claim 8, wherein the apparatus comprises means in which the imaging parameter whose setting is changed each time so as to record said number of experimental images is the focal distance of the imaging lens.

12. A particle-optical apparatus as claimed in claim 11, wherein the apparatus comprises means which are arranged to carry out the following steps:

varying, the focal distance with a constant step size (the focus step size) during the recording of said number of experimental images;

selecting each time a different set of values of imaging parameters leading to temporal incoherence, for which each time an item $p_i(\vec{G})$ of the set of transfer functions is defined, in such a manner that the focal distance associated with each item of said each time different set of values is varied with a constant step size (the coherence step size), selecting the focus step size and the coherence step size so that they are equally large.

13. A particle-optical apparatus as claimed in claim 11, wherein the apparatus comprises means which are arranged to determine the weighting factors $g_i$, occurring due to a spread in the focal distance of the imaging lens which is caused by temporal incoherence, in such a manner that these weighting factors are chosen by application of a minimalization procedure where the quantity to be minimized is formed by either the maximum absolute deviation or by the root mean square deviation between the analytic envelope function, in the transmission cross-coefficient, determined by temporal incoherence, and the form determined by means of said weighting factors.

* * * * *